United States Patent [19]
Beurrier

[11] 3,748,588
[45] July 24, 1973

[54] IMPEDANCE-MATCHED AMPLIFIERS

[75] Inventor: Henry Richard Beurrier, Chester Township, County of Morris, N.J.

[73] Assignee: Bell Telephone Laboratories, Incorporated, Murray Hill, N.J.

[22] Filed: Dec. 20, 1971

[21] Appl. No.: 209,527

[52] U.S. Cl. .......................... 330/30 R, 330/124 R
[51] Int. Cl. .......................... H03f 3/68
[58] Field of Search .......................... 330/30 R, 124 R

[56] References Cited

UNITED STATES PATENTS

| | | | |
|---|---|---|---|
| 3,403,357 | 9/1968 | Rosen et al. | 330/124 R X |
| 3,336,540 | 8/1967 | Kwartiroff et al. | 330/124 R X |
| 3,585,516 | 6/1971 | Ricaghi | 330/124 R X |
| 3,360,739 | 12/1967 | Cooke-Yarborough | 330/124 R |
| 3,436,676 | 4/1969 | Cook | 330/124 R X |
| 3,611,145 | 10/1971 | O'Connor | 330/86 X |
| 3,202,927 | 8/1965 | Ishimoto et al. | 330/124 R X |

*Primary Examiner*—Nathan Kaufman
*Attorney*—W. L. Keefauver et al.

[57] ABSTRACT

This application describes a class of amplifiers comprising two active stages having mutually inverse input impedances coupled to a common source by means of an impedance-matching input circuit, and to a common output load by means of an output circuit. In previously described amplifiers, of a related class, the required signal balance at the output of the active stages was produced by the output coupling circuit. In the amplifiers described herein, this signal balance is obtained by means associated with one or the other of the active stages. By relieving the output circuit of this function, a greater variety of output circuits is possible.

4 Claims, 5 Drawing Figures

IMPEDANCE-MATCHED AMPLIFIERS

This invention relates to impedance-matched amplifiers.

BACKGROUND OF THE INVENTION

In my copending applications Ser. Nos. 113,200, 113,213, filed Feb. 8, 1971, and Ser. No. 126,683, filed Mar. 22, 1971, there are disclosed a variety of impedance-matched amplifiers having certain noise and distortion reducing advantages. In each of the amplifiers disclosed, passive coupling networks are employed to couple a common source to the inputs of a pair of active stages, and to couple the outputs from the active stages to a common output load.

It is a characteristic of all of these amplifiers that the requisite current balance between the two active stages is produced by the output circuit. As a result, the type of output circuit that can be employed is limited.

It is, accordingly, a broad object of this invention to enlarge the variety of impedance-matched amplifiers that can be devised while retaining the noise and distortion reducing advantages inherent in the above-identified class of amplifiers.

It is a more specific object of the present invention to provide convenient means for varying the gain characteristic of impedance-matched amplifiers.

SUMMARY OF THE INVENTION

In accordance with the present invention, the signal balance in the two active stages comprising an amplifier of the type under consideration is obtained by means of an impedance associated with one or the other of the active stages. By relieving the output circuit of this function, a greater variety of output circuits is possible.

In a first specific embodiment of the invention, the currents from the two active stages are made equal, and then caused to flow through two equal impedances. The resulting equal, but out-of-phase voltages are used to drive a differential amplifier. The amplifier gain is conveniently controlled by simultaneously varying the magnitudes of the two impedances.

Where output match, or gain control is not necessary, a number of simplified amplifiers can be realized. For example, in a second embodiment of the invention, the higher input impedance active stage simultaneously serves as one of the active elements of the output differential amplifier, and the signal balance is obtained by means of an impedance in the output circuit of the lower input impedance stage.

In a third embodiment of the invention, the signal balance is obtained by limiting the current in the higher input impedance stage, and the output network is a simple N:1 turns ratio transformer.

In those cases where an output match is required, and/or a gain characteristic which varies as a function of frequency is required, an added network comprising an additional pair of active elements is interposed between the amplifier output port and the output load.

These and other objects and advantages, the nature of the present invention, and its various features, will appear more fully upon consideration of the various illustrative embodiments now to be described in detail in connection with the accompanying drawings.

DETAILED DESCRIPTION

Figure 1:
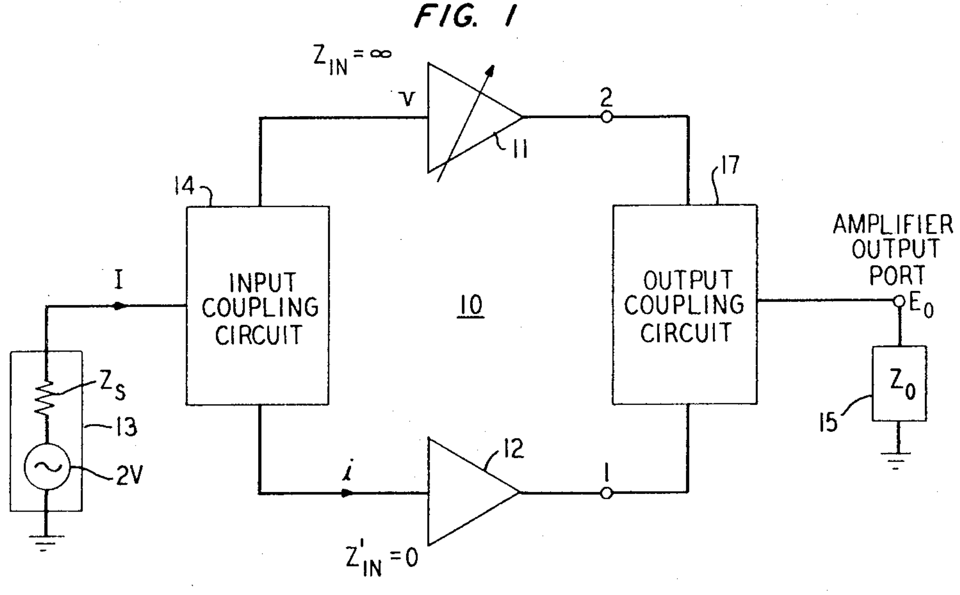
FIG. 1 shows, in block diagram, an amplifier in accordance with the present invention.

Referring to the drawings, FIG. 1 shows, in block diagram, an amplifier 10 in accordance with the present invention, comprising a pair of active stages 11 and 12 coupled to a common signal source 13 by means of an input coupling network 14, and to a common output load 15 by means of an output coupling circuit 17.

The active stages, which can include one or more active elements, have mutually inverse input impedances, where the term "mutually inverse impedances," as used herein, means that relative to some reference impedance, the input impedance of one active stage is much larger (preferably at least an order of magnitude greater) than the reference impedance, while the input impedance of the other active stage is much smaller (preferably at least an order of magnitude less) than the chosen reference. In an amplifier, in accordance with the present invention, the input impedance is measured relative to the source impedance $Z_s$, or some small multiple of $Z_s$. Thus, in the illustrative embodiment of FIG. 1, the input impedance $Z_{in}$ of one of the stages 11 is much larger ($Z_{in} = \infty$) than the source impedance $Z_s$, as seen by stage 11 through network 14, and the input impedance $Z_{in}$ of the other 12 is much less ($Z'_{in} = O$) than the source impedance as seen by stage 12 through network 14.

Coupling network 14 is any network capable of coupling source 13 to the two active stages 11 and 12 such that the source sees a match. In terms of the source current I, the coupling network is such that $$I = V/Z_s, \qquad (1)$$

where 2V is the source open-circuit voltage. A variety of such circuits are illustrated in my above-identified applications.

The output from network 14 is a current i, coupled to stage 12, and a voltage $v$ coupled to stage 11.

In general, the output signals from stages 11 and 12 will depend upon the nature of the stages and the relative amplitudes of the input signals $i$ and $v$. In my above-identified applications, it was one of the functions of the output coupling circuit to balance the output signals and combine them constructively in the output load. In accordance with the present invention, the requisite signal balance is achieved by means associated with one or the other of the active stages, thus relieving the output circuit of this function. Accordingly, means are included in one of the active stages 11, as indicated by the arrow, for controlling the output signal from stage 11 at some level relative to the output signal from stage 12. The two signals, so proportioned, are then combined constructively in load 15 by means of output circuit 17.

Figure 2:
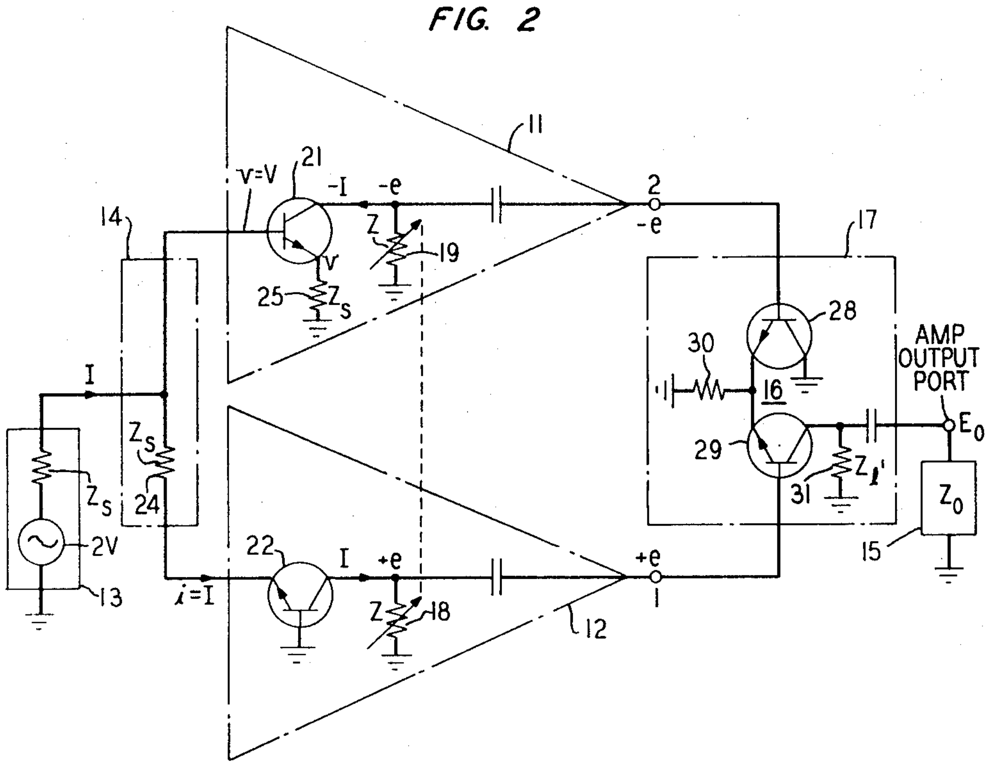
FIG. 2 shows a specific embodiment of the amplifier illustrated in FIG. 1.

FIG. 2, now to be considered, shows a specific configuration of the amplifier shown in block diagram in FIG. 1. For purposes of illustration, active stage 11 comprises a single transistor 21, connected in a common emitter configuration. In particular, the transistor emitter is connected to ground through an impedance 25. The transistor collector is connected to a resistor 19. The input impedance to the base electrode of this active stage is, therefore, very high. Stage 12 also comprises a single transistor 22, connected in the common base configuration. Specifically, the transistor base electrode is grounded, and the collector electrode is connected to a resistor 18. The input impedance to the emitter electrode of this active stage is, therefore, very small. To avoid unduly complicating the drawings, the standard direct current biasing circuits for the various transistors have not been shown in any of the figures. Only the signal circuits are illustrated.

The signal source 13 is coupled to the two stages by a coupling network 14 of the type illustrated in my above-identified copending application Ser. No. 113,200. In this arrangement, the signal source is connected directly to the higher input impedance stage 11, and through a series matching impedance 24 to the lower input impedance stage 12. Specifically, the series impedance is equal to the source impedance $Z_s$. Since stage 11 is essentially an open circuit to the source, and stage 12 is essentially a short circuit, all of the source current I flows into transistor 22 (i.e., $i = I$). The magnitude of I is given by $$I = (2V)/(2Z_s) = (V)/(Z_s). \quad (2)$$

As this current is the same as that given by equation 1, the amplifier is, thus, matched to the signal source. The voltage $v$ at the input stage 11 is given by $$v = IZ_s = V. \quad (3)$$

Since the collector current of a common base transistor is approximately equal to the emitter current, a current I will also flow into resistor 18, producing a voltage $$e = IZ \quad (4)$$

at one of the input terminals 1 of output coupling circuit 17 which, in this embodiment, is a differential amplifier 16.

In stage 11, approximately the entire input voltage $v$ is coupled to the emitter of transistor 21 and impressed across emitter resistor 25 which, in this particular circuit configuration, has a magnitude $Z_s$ equal to the source impedance. The resulting collector current, $$I = V/Z_s, \quad (5)$$

flowing through resistor 19 produces a voltage −e at the other input terminal 2 of output coupling circuit 17 which is equal to that produced by stage 12, but because of the relative direction of current flow, is of opposite polarity.

Amplifier 16 is a standard differential amplifier comprising two transistors 28 and 29 whose emitters are connected to a common high impedance 30. One of the transistors 29 is provided with a collector impedance 31, of magnitude $Z_l$, across which the output signal $E_o$ is developed. With the bases of the two transistors excited in the antisymmetric mode, a signal is developed across impedance 31 and coupled to the useful load impedance 15.

It will be noted that in this embodiment, amplifier 10 can also be matched at its output port by making collector impedance 31 equal to the load impedance $Z_o$. If a match is not required, the collector impedance can be any convenient value. Alternatively, an impedance-matching transformer can be used to match a relatively low load impedance to some other, more realistic collector impedance.

It will also be noted that in this amplifier, the output current of stage 11 is determined by the emitter impedance 25, rather than by the output coupling circuit, as is the case in the various amplifiers described in my copending applications. This permits much greater freedom in the design of the amplifier output circuit. The amplifier, however, retains the noise and distortion advantages of this case of amplifier in that any distortion due to variations in the emitter impedance of stage 22, and the noise introduced by matching impedance 24, cause symmetric voltages to appear at the input terminals of differential amplifier 16 which are not communicated to the output load. It will finally be noted that by making impedances 18 and 19 variable and ganging them, the gain of the amplifier can be conveniently controlled.

Figure 3:
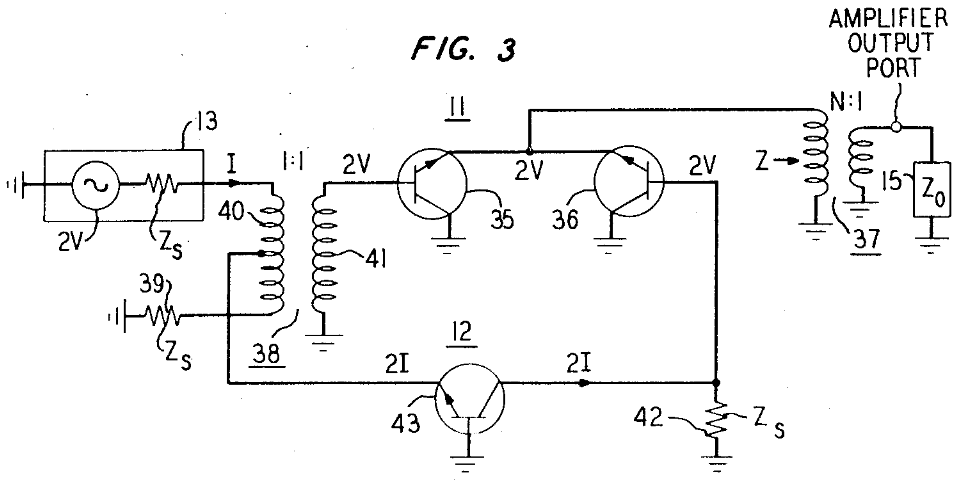
FIGS. 3 and 4 show two alternative embodiments of the invention.

FIG. 3 is an alternative embodiment of the invention in which the higher input impedance stage also serves as one of the active elements of the differential amplifier. Thus, in this embodiment, transistor 35, connected in the common collector configuration, is both the higher input impedance stage and, in conjunction with transistor 36, serves as one of the two active elements of a differential amplifier. In this particular embodiment, the output signal is taken from the common emitter portion of the differential amplifier. In particular, it illustrates the use of an N:1 turns ratio transformer 37 to couple between the output load impedance 15 and the differential amplifier. Since the latter typically employs a large emitter impedance for increased gain, the turns ratio is selected to transform the output impedance $Z_o$ to the desired level. Alternatively, the output can be taken from the collector circuit. In either case, it will be noted that in this embodiment the output terminal of the amplifier would not necessarily be matched to the load.

At the input end, a 1:1 turns ratio transformer 38 is used as the coupling network in the manner described by H. Seidel in his copending application Serial No. 204804, filed Dec. 6 , 1971. Specifically, signal source 13 is connected to one end of one of the transformer windings 40. A matching impedance 39 is connected to the other end of winding 40. The lower input impedance stage 12 is connected to a center-tap on winding 40, and the higher input impedance stage 11 is connected across the other transformer winding 41.

In operation, source 13 causes a current I to flow into winding 40, inducing a current $2I$ to flow into stage 12, comprising transistor 43, and a voltage $2V$ to be applied at the input of stage 11, comprising transistor 35, where $$I = V/Z_s \, . \quad (6)$$

The amplifier is, thus, matched at the input end.

The collector current 2I in stage 12 flows into an impedance 42 equal to the source impedance $Z_s$, causing a voltage 2V to appear at the base of transistor 36. This, along with an equal, in-phase voltage 2V at the base of transistor 35 provides a symmetric excitation of the differential amplifier, which is communicated through transformer 37 to the output load.

It will be noted that in this embodiment of the invention, distortion effects and the equivalent noise of matching impedance 39 cause an antisymmetric excitation of transistors 35 and 36 which is not communicated to the output load.

Figure 4:
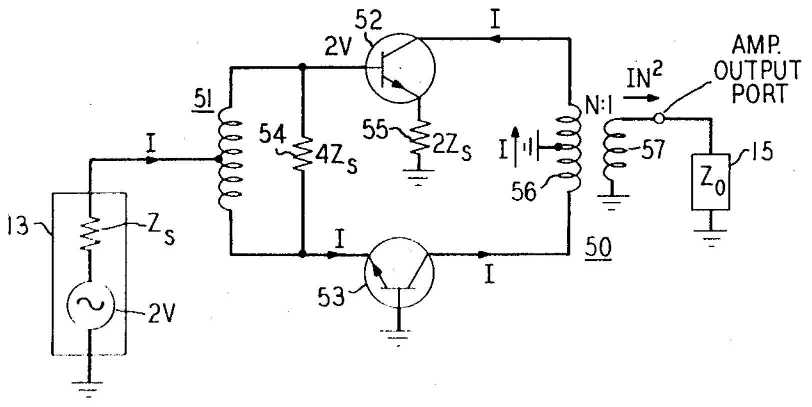

FIG. 4 shows a third embodiment of the invention which employs a simple N:1 turns ratio transformer 50 as the output coupling network. For purposes of illustration, the input network is of the type illustrated in my copending application Ser. No. 204865, filed Dec. 6, 1971, comprising an autotransformer 51 whose ends are connected, respectively, to the two active stages. Specifically, one end of transformer 51 is connected to the base electrode of transistor 52. The other end of transformer 51 is connected to the emitter electrode of transistor 53. Source 13 is connected to a center-tap along the autotransformer, and a matching impedance 54, of magnitude $4Z_s$ is connected across the autotransformer.

Transistor 52 is connected in the common emitter configuration with a current limiting impedance 55 in series with the emitter. Transistor 53 is connected in the common base configuration.

The collector electrodes of the respective transistors are connected to opposite ends of primary winding 56 of output transformer 50. Advantageously, a center-tap along winding 56 is grounded. The secondary winding 57 of the output transformer is connected to the output load impedance 15.

In operation, signal source 13 produces a voltage 2V at the base of transistor 52 and causes a current I to flow into the emitter of transistor 53, where $V=IZ_s$. An equal current I, in turn, flows out of the collector of transistor 53, and into the lower end of transformer winding 56.

The collector current produced in transistor 52 is limited by an impedance 55 connected in series with the emitter electrode. Since the base voltage $2V$ also appears across impedance 55, the magnitude of the impedance 55 is made equal to $2Z_s$, such that the collector current, $2V/2Z_s$, is equal to I. However, since the current in transistor 52 is 180° out of phase with the current in transistor 53, current I flows out of the upper terminal of transformer winding 56 and into the collector of transistor 52 at the same time that an equal current is flowing out of the collector of transistor 53 and into the lower terminal of winding 56. Because of the transformer turns ratio, a current $IN_2$ is coupled into the output load impedance 15.

It will be noted that the amplifier is not matched to the output impedance in this embodiment. However, this circuit does have the noise and distortion reducing characteristics of this class of amplifier since distortion effects in the emitter circuit of transistor 53, and the equivalent noise voltage of matching impedance 54 produce in-phase currents which are not coupled to the output load by transformer 50.

Figure 5:
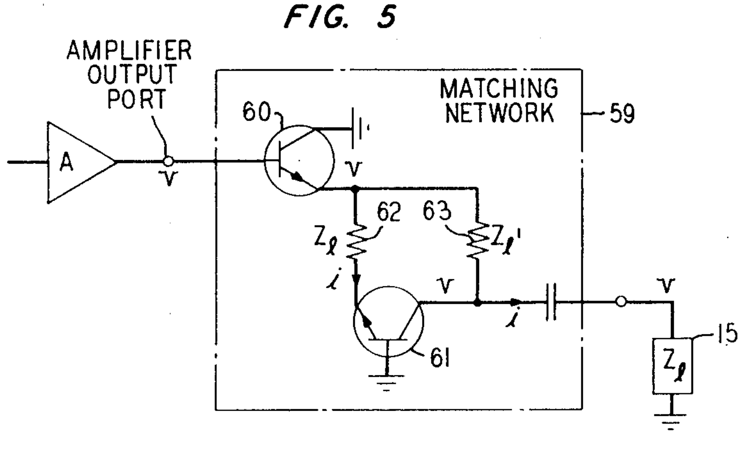
FIG. 5 shows a circuit for producing a match at the amplifier output port.

If an output match is desired, it can be conveniently obtained by the inclusion of a matching network 59 of the type shown in FIG. 5 between the amplifier output port and load 15. This circuit comprises a first transistor 60, connected in the common collector configuration, and a second transistor 61, connected in the common base configuration. The base electrode, being the input port of the network, is connected to the amplifier output port. The emitter of transistor 60 is connected, by means of a pair of impedances 62 and 63, to the emitter and collector, respectively, of transistor 61. The output load 15 is connected to the collector of transistor 61.

In operation, the output voltage $v$ from the amplifier produces a voltage $v$ across impedance 62, which causes a current $i$ to flow into the emitter of transistor 61. This, in turn, causes an equal current to flow from the collector of transistor 61 into load impedance 15. By making the magnitude of impedance 62 approximately equal to the load impedance, the current $i$ will produce an output voltage $v$ across load 15 such that the voltages at both ends of impedance 63 are equal, resulting in no current through impedance 63.

The output impedance of this network, i.e., the impedance seen by the load, is that of impedance 63. As this impedance can be made equal to the load impedance, the latter can be made to see a match. As is evident, different values for impedances 62 and 63 can be used by the inclusion of an output transformer to couple between load 15 and matching network 59. Indeed a match, or any desired mismatch can be obtained by means of this circuit. In addition, by using an output network of this type, a frequency sensitive impedance can be conveniently introduced into the amplifier so as to obtain any arbitrary gain-frequency characteristic. For example, in the embodiment of FIG. 2, collector impedance 31 can be replaced by any arbitrary frequency sensitive impedance to produce a shaped gain characteristic. It will also be recognized that the use of a single transistor as the active stage is merely illustrative. More generally, each active stage can include one or more active elements such as was illustrated in my above-cited copending applications. Thus, in all cases, it is understood that the above-described arrangements are illustrative of but a small number of the many possible specific embodiments which can represent applications of the principles of the invention. Numerous and varied other arrangements can readily be devised in accordance with these principles by those skilled in the art without departing from the spirit and scope of the invention.

I claim:

1. An amplifier for coupling between a signal source and an output load comprising:

a first active stage including a first transistor connected in the common emitter configuration and having an input impedance that is an order of magnitude greater than the impedance of said source, and a second active stage including a second transistor connected in the common base configuration and having an input impedance that is an order of magnitude smaller than the impedance of said source;

impedance matching means for coupling the input ends of said stages to said source;

means comprising a current-limiting resistor connector in series with the emitter of said first transistor for equalizing the output signals from said two active stages;

and means for coupling said equalized output signals to said output load.

2. The amplifier according to claim 1 wherein the signal voltages produced by said two stages are coupled to the output load by means of a differential amplifier.

3. The amplifier according to claim 1 wherein said signals, being equal and 180° out of phase, are coupled, respectively, to opposite ends of one winding of an N:1 turns ratio transformer, where N is any number greater than zero;

and wherein said output load is connected across the other winding of said transformer.

4. An amplifier for coupling between a signal source and an output load comprising:

a first transistor connected in the common collector configuration;

a second transistor connected in the common base configuration;

impedance matching means for coupling the base of said first transistor and the emitter of said second transistor to said signal source means comprising an impedance connected to the collector of said second transistor for equalizing the output signals from said two transistors;

and means for coupling said equalized output signals from said two transistors to said output load comprising a third transistor and an N:1 turns ratio transformer;

Characterized in that:

the voltage developed across said collector impedance is coupled to the base of said third transistor;

the emitters of said first and third transistors are connected to the primary winding of said transformer;

and the output load is connected to the transformer secondary winding.

* * * * *